United States Patent
Carter et al.

(10) Patent No.: US 7,723,192 B2
(45) Date of Patent: May 25, 2010

(54) INTEGRATED CIRCUIT LONG AND SHORT CHANNEL METAL GATE DEVICES AND METHOD OF MANUFACTURE

(75) Inventors: Richard J. Carter, Hopewell Junction, NY (US); Michael J. Hargrove, Clinton Corners, NY (US); George J. Kluth, Hopewell Junction, NY (US); John G. Pellerin, Hopewell Junction, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 98 days.

(21) Appl. No.: 12/048,414

(22) Filed: Mar. 14, 2008

(65) Prior Publication Data

US 2009/0230463 A1   Sep. 17, 2009

(51) Int. Cl.
   *H01L 21/8234* (2006.01)
(52) U.S. Cl. .............................. 438/275; 257/E21.444; 257/E21.623; 257/E21.624
(58) Field of Classification Search ........... 257/E21.624
   See application file for complete search history.

(56) References Cited

U.S. PATENT DOCUMENTS

| | | | |
|---|---|---|---|
| 6,248,675 B1 * | 6/2001 | Xiang et al. ................ | 438/166 |
| 6,255,698 B1 * | 7/2001 | Gardner et al. .............. | 257/369 |
| 6,468,851 B1 | 10/2002 | Ang et al. | |
| 6,875,680 B1 * | 4/2005 | Park ........................... | 438/595 |
| 7,151,023 B1 * | 12/2006 | Nayfeh et al. ............... | 438/231 |
| 2005/0064663 A1 * | 3/2005 | Saito .......................... | 438/275 |
| 2005/0186747 A1 | 8/2005 | Amos et al. | |
| 2006/0102962 A1 | 5/2006 | Saito | |
| 2007/0057331 A1 | 3/2007 | Satou et al. | |
| 2008/0073733 A1 * | 3/2008 | Kudo et al. ................. | 257/412 |

OTHER PUBLICATIONS

International Search Report for PCT/US2009/001617 mailed Jul. 2, 2009.

* cited by examiner

*Primary Examiner*—Stephen W Smoot
(74) *Attorney, Agent, or Firm*—Ingrassia Fisher & Lorenz, P.C.

(57) ABSTRACT

A method is provided for manufacturing an integrated circuit including a short channel (SC) device and a long channel (LC) device each overlaid by an interlayer dielectric. The SC device has an SC gate stack and the LC device initially has a dummy gate. In one embodiment, the method includes the steps of removing the dummy gate to form an LC device trench, and depositing metal gate material over the SC device and the LC device. The metal gate material contacts the SC gate stack and substantially fills the LC device trench.

19 Claims, 7 Drawing Sheets

INTEGRATED CIRCUIT LONG AND SHORT CHANNEL METAL GATE DEVICES AND METHOD OF MANUFACTURE

TECHNICAL FIELD

The present invention relates generally to an integrated circuit and, more particularly, to an integrated circuit having both long and short channel metal gate devices and a method for making such a circuit.

BACKGROUND

The majority of present day integrated circuits (ICs) are implemented utilizing a plurality of interconnected field effect transistors (FETs), also referred to as metal oxide semiconductor field effect transistors (MOSFETs) or simply MOS transistors. A MOS transistor includes a gate electrode, which serves as a control electrode, and source and drain electrodes. A channel extends between the source and drain electrodes. Current flows through this channel upon application of a voltage (referred to as the "threshold voltage" or $V_t$) to the gate electrode sufficient to form an inversion region in the transistor substrate.

For MOS transistors employing metal gate stacks and high-k dielectrics, it is desirable that the target $V_t$ (referred to herein as the "bandedge $V_t$") corresponds to within 100 millivolts of the conduction band or valence band edge whether the device is NMOS or PMOS. It has, however, proven difficult to construct a metal gate MOS transistor having a bandedge $V_t$ for several reasons. Fixed positive charges due to oxygen vacancies present in the high-k material may shift the transistor's threshold voltage away from the desired bandedge $V_t$. Furthermore, metals having work functions that yield bandedge threshold voltages (e.g., work functions of approximately 4.7-5.1 electron volts) are typically thermally unstable at temperatures exceeding 400 degrees Celsius. Such thermally unstable metals are generally unable to withstand the high temperatures experienced during source-drain activation annealing. For this reason, a gate-last approach is typically employed to construct MOS transistors including metal gates formed from thermally unstable metals. For example, a damascene process may be employed wherein a dummy gate is initially installed and subsequently removed via etching to produce a trench. A thermally unstable metal may then be deposited into the trench and polished to define a permanent metal gate.

While being generally well-suited for use in conjunction with long channel (LC) transistors (e.g., devices wherein the channel length exceeds a predetermined value, which may be, for example, approximately 0.1 µm), the above-described damascene process has certain disadvantages when utilized in conjunction with short channel (SC) transistors (e.g., devices wherein the channel length is equal to or less than the predetermined value). For example, due to the small size of the device, the entire dummy gate may not be removed during the etching process. Furthermore, when deposited over the open trench of an SC transistor, the metal gate material may pinch-off near the mouth of the trench before the trench is completely filled. Voiding can consequently occur within the body of the trench. Thus, for an IC including SC transistors and LC transistors, the damascene process is generally unacceptable and an etching process is generally utilized to construct the metal gates for both types of transistors thus generally preventing the use of thermally unstable metals in LC transistors to achieve bandedge voltage thresholds.

Accordingly, it would be desirable to provide a method for manufacturing a MOS transistor having short channel devices and long channel devices that permits bandedge voltage thresholds to be achieved for both the short and long channel devices. In particular, it would be desirable for such a method to permit thermally unstable metals to be utilized in the fabrication of the long channel devices, while also permitting oxygen vacancies present in the short channel devices to be repaired. Furthermore, other desirable features and characteristics of the present invention will become apparent from the subsequent detailed description and the appended claims, taken in conjunction with the accompanying drawings and the foregoing technical field and background.

BRIEF SUMMARY

A method is provided for manufacturing an integrated circuit including a short channel (SC) device and a long channel (LC) device each overlaid by an interlayer dielectric. The SC device has an SC gate stack and the LC device initially has a dummy gate. In one embodiment, the method includes the steps of removing the dummy gate to form an LC device trench, and depositing metal gate material over the SC device and the LC device. The metal gate material contacts the SC gate stack and substantially fills the LC device trench.

In accordance with another embodiment, an integrated circuit is provided that includes a substrate, a short channel (SC) device, a long channel (LC) device, an etch stop layer deposited over an upper surface of the substrate, and an interlayer dielectric deposited over an upper surface of the etch stop layer. The SC device and the LC device each include a source formed in the substrate, a drain formed in the substrate and spaced apart from the source, and a channel formed in the substrate between the source and drain. The SC device further includes an SC gate stack, which, in turn, includes an SC gate insulator disposed above the channel, an SC metal gate disposed above the gate insulator, a polycrystalline silicon layer disposed above the metal gate, and a silicide layer disposed above the polycrystalline silicon layer. The LC device further includes an LC gate insulator disposed above the channel, and an LC metal gate contacting the gate insulator. An SC cap is disposed in the interlayer dielectric and contacts the SC gate stack. The SC gate stack and the LC metal gate extend through the etch stop layer, and the SC cap and the LC metal gate are exposed through the upper surface of the interlayer dielectric.

In accordance with another embodiment, an integrated circuit is provided that includes a substrate, a short channel (SC) device, a long channel (LC) device, an etch stop deposited over an upper surface of the substrate, and an interlayer dielectric deposited over an upper surface of the etch stop layer. The SC device includes an SC gate insulator disposed above a first portion of the substrate, an SC metal gate disposed above the gate insulator, a polycrystalline silicon layer disposed above the metal gate, and a silicide layer formed on the polycrystalline silicon layer. The LC device includes an LC gate insulator disposed above a second portion of the substrate, and an LC metal gate overlying the gate insulator. An SC cap is disposed in the interlayer dielectric, contacts the SC gate stack, and is substantially formed from the same metal as is the LC metal gate.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. Although the term "MOS device" properly refers to a device having a metal gate electrode and an oxide gate insulator, that term will be used throughout to refer to any semiconductor device that includes a conductive gate electrode that is positioned over a gate insulator (whether oxide or other insulator) which, in turn, is positioned over a semiconductor substrate.

An exemplary method for the manufacture of an integrated circuit having a P-type short channel (SC) transistor and a P-type long channel (LC) transistor will be described below in conjunction with FIGS. 1-14. However, it is emphasized that alternative embodiments of the inventive method can be utilized to construct an integrated circuit including other types of SC and LC devices. For example, similar method steps are suitable for use in the manufacture of an N-type MOS device with appropriate changes in dopant types. Likewise, similar method steps can used to manufacture complementary MOS transistors (CMOS). Furthermore, various steps in the manufacture of MOS transistors are well-known and, in the interests of brevity, will only be mentioned briefly herein or will be omitted entirely without providing the well-known process details.

FIGS. 1-9 and 11-14 are simplified cross-sectional views illustrating various steps of an exemplary method for manufacturing an integrated circuit including a short channel (SC) device and a long channel (LC) device. For the purposes of the present description, a "short channel device" is defined as a device having a channel length less than a predetermined length (L). Conversely, a "long channel device" is defined as a device having a channel length equal to or greater than the predetermined length (L). The value of the predetermined length (L) will inevitably vary amongst different embodiments; however, as a non-limiting example, the predetermined length (L) may have a value of approximately 0.1 micrometer (μm).

Figure 1:
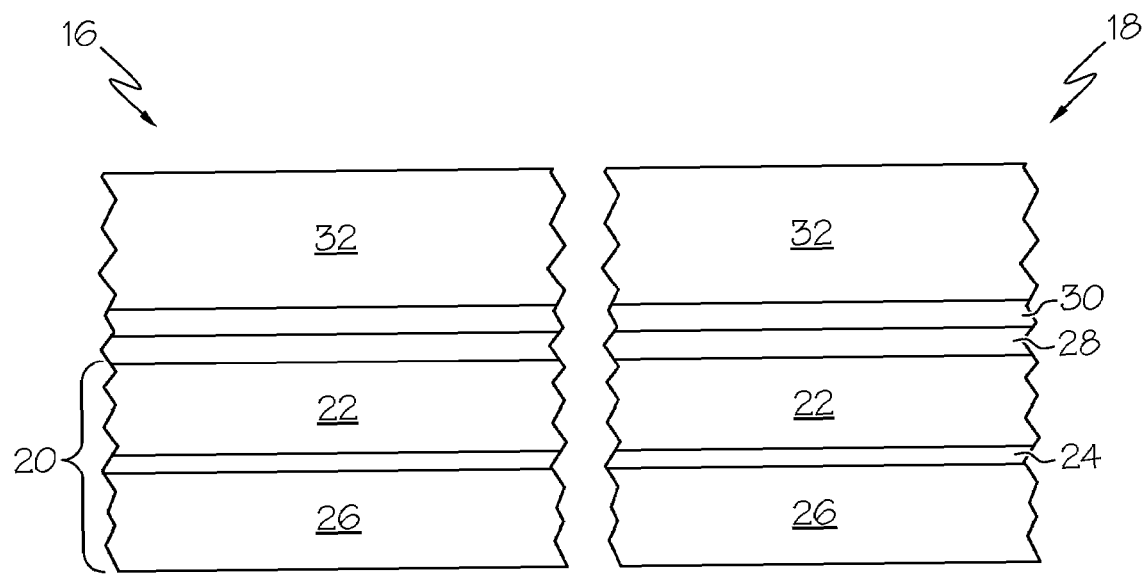
FIGS. 1-9 are simplified cross-sectional views illustrating a first group of steps performed during an exemplary device manufacturing process.

Referring initially to FIG. 1, the exemplary method of manufacture commences with the step of providing a semiconductor substrate 20 on which an LC transistor 16 and a transistor 18 will be constructed. Semiconductor substrate 20 is preferably a silicon substrate (the term "silicon substrate" is used herein to encompass the relatively pure silicon materials typically used in the semiconductor industry as well as silicon admixed with other elements, such as germanium and the like). Silicon substrate 20 can be a bulk silicon wafer. Alternatively, and as shown in FIG. 1, silicon substrate 20 can comprise a thin layer of silicon 22 on an insulating layer 24 (commonly know as a "silicon-on-insulator wafer" or "SOI wafer") that is, in turn, supported by a silicon carrier wafer 26.

A gate insulator layer 28 is formed on the upper surface of silicon substrate 22. Gate insulator layer 28 may be a thermally grown silicon dioxide formed by heating the silicon substrate in an oxidizing ambient; however, it is preferred that gate insulator layer 28 is formed by the deposition of a high-k dielectric material, such as HfSiO, HfO$_2$, ZrO$_2$, or any other standard high-k dielectric. Any suitable deposition technique may be utilized to form gate insulator layer 28, such as chemical vapor deposition (CVD), low pressure chemical vapor deposition (LPCVD), and plasma enhanced chemical vapor deposition (PECVD). Gate insulator layer 28 is preferably deposited to a thickness less than approximately 5 nanometers (nm) and ideally to a thickness less than approximately 3 nm.

Referring still to FIG. 1, a metal gate layer 30 is deposited on gate insulator layer 28 utilizing a conventional deposition technique. The metal deposited to form metal gate layer 30 will be chosen, in part, to yield a desired threshold voltage ($V_t$) for SC transistor 16, although it will be appreciated that other factors (e.g., the oxidation process described below) will also affect the final $V_t$ of SC transistor 16. A non-exhaustive list of metals suitable for use in the formation of metal gate layer 30 includes TiN, TaN, HfSi, and TaC. Metal gate layer 30 is preferably deposited to a thickness of approximately 2-10 nm.

In the illustrated exemplary embodiment, a layer of polycrystalline silicon 32 is deposited onto the upper surface of metal gate layer 30. Polycrystalline silicon layer 32 is preferably deposited as undoped polycrystalline silicon that is subsequently impurity doped by ion implantation, although the polycrystalline silicon may also be doped in situ. In one implementation, polycrystalline silicon layer 32 is deposited utilizing LPCVD and the hydrogen reduction of silane. Polycrystalline silicon layer 32 is preferably deposited to a thickness of approximately 50-100 nm.

Figure 2:
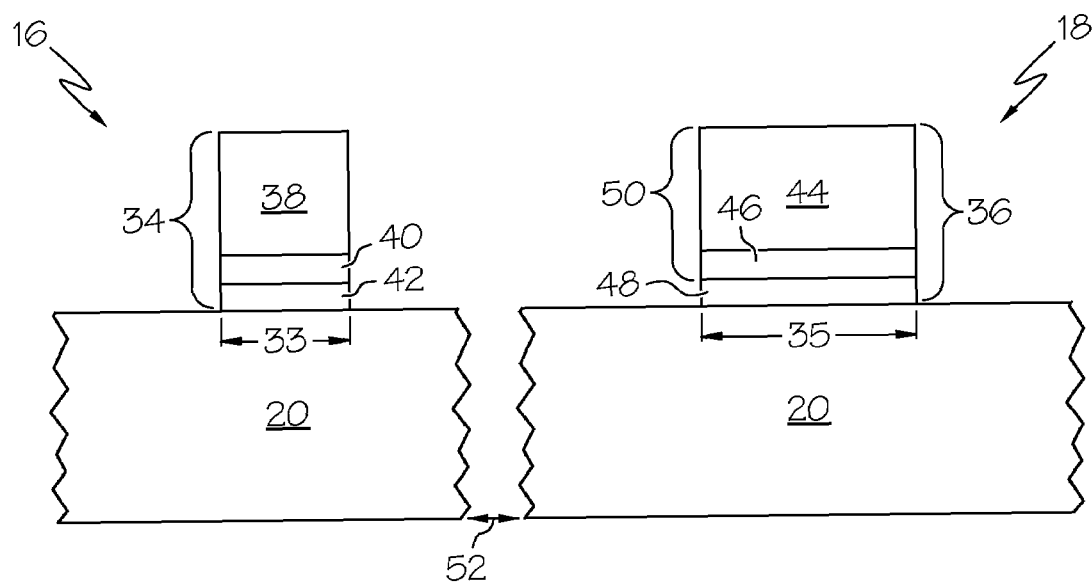

FIG. 2 illustrates SC transistor 16 and LC transistor 18 after the performance of conventional patterning and etching steps. SC transistor 16 is etched to define a first gate stack 34 having a channel length (indicated in FIG. 2 by arrow 33) less than a predetermined length (L) and is consequently referred to herein as a short channel (SC) gate stack. Similarly, LC transistor 18 is etched to define a second gate stack 36 that has a channel length (indicated in FIG. 2 by arrow 35) equal to or greater than the predetermined length (L) and is consequently referred to herein as a long channel (LC) gate stack. As previously stated, the predetermined length (L) may have an exemplary value of approximately 0.1 μm.

SC gate stack 34 comprises a polycrystalline silicon layer 38 formed from polycrystalline silicon layer 32 (FIG. 1), a metal gate 40 formed from metal gate layer 30 (FIG. 1), and a gate insulator 42 formed from gate insulator layer 28 (FIG. 1). LC gate stack 36 likewise comprises a polycrystalline silicon layer 44 formed from polycrystalline silicon layer 32 (FIG. 1), a metal gate 46 formed from metal gate layer 30 (FIG. 1), and a gate insulator 48 formed from gate insulator layer 28 (FIG. 1). As will be described in detail below, SC gate stack 34 serves as a permanent gate stack within SC transistor 16. In contrast, a portion of LC gate stack 36, namely polycrystalline silicon layer 44 and metal gate 46, is replaced during processing. For this reason, polycrystalline silicon layer 44 and metal gate 46 may be collectively referred to as the "LC dummy gate" herein below.

As indicated in FIG. 2 by arrow 52, SC transistor 16 is separated from LC transistor 18 by a non-illustrated portion of the integrated circuit. Although not shown in FIG. 2, it will be appreciated by one of ordinary skill in the art that an electrically-isolating element is formed within this non-illustrated portion between SC transistor 16 and LC transistor 18. Any suitable process can be utilized to form the electrically-isolating element; e.g., a conventional shallow trench isolation process can be employed wherein a shallow trench is etched into substrate 20, a thermal oxide liner is grown in the shallow trench, and an oxide is deposited into the trench and over the thermal oxide liner.

Figure 3:
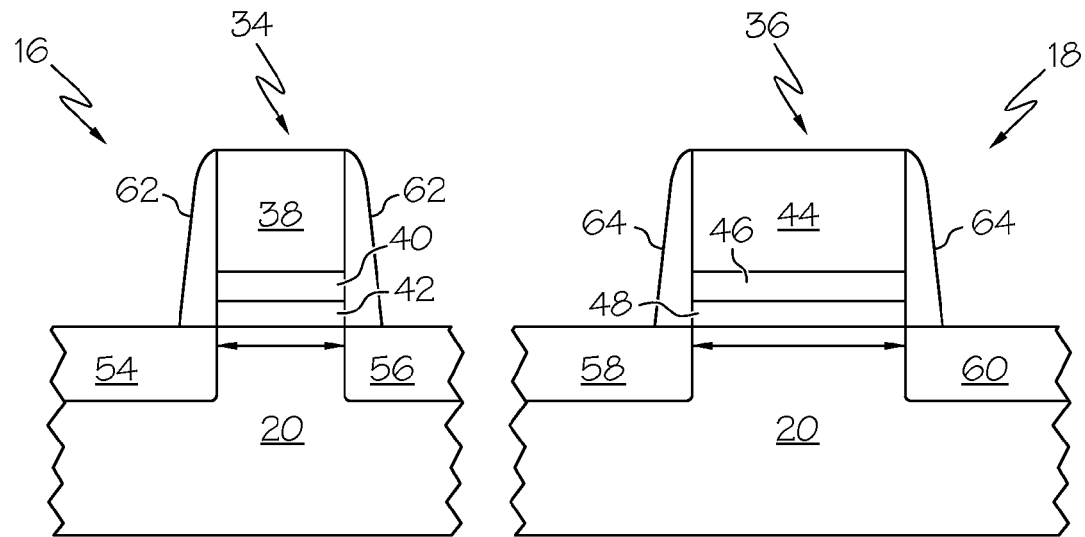

FIG. 3 illustrates SC transistor 16 and LC transistor 18 after the formation of source drain regions 54, 56 and sidewall spacers 62 near SC gate stack 34 and source drain regions 58, 60 and sidewall spacers 64 near LC gate stack 36. To create source 54 and drain 56, selected ions are implanted into substrate 20 proximate SC gate stack 34, which serves as an ion implantation mask. Similarly, to form source 58 and drain 60, selected ions are implanted into substrates 20 proximate LC gate stack 36, which also serves as a mask. By way of example, boron ions can be implanted for a P-type MOS transistor; however, the particular ions selected for implantation will be dependent upon the type of device being constructed (e.g., for an N-type MOS transistor arsenic or phosphorus ions may be implanted). After ion implantation, an activation anneal is performed to electrically activate the implanted ions and to repair any imperfections in the silicon lattice caused by the ion implantation process.

Sidewall spacers 62 and sidewall spacers 64 are formed adjacent opposing sidewalls of SC gate stack 34 and LC gate stack 36, respectively. In accordance with one exemplary technique, a spacer-forming material (e.g., $SiO_2$) is deposited over substrate 20, SC gate stack 34, and LC gate stack 36. The spacer-forming material can be deposited to an exemplary thickness of approximately 15 nm utilizing LPCVD. The spacer-forming material is then anisotropically etched utilizing, for example, a reactive ion etching (RIE) technique employing a $CHF_3$, $CF_4$, or $SF_6$ chemistry. This results in the formation of sidewall spacers 62 on opposing sidewalls of SC gate stack 34 and sidewall spacers 64 on opposing sidewalls of LC gate stack 36. Although not shown in FIG. 3, the sidewall spacers may be formed to include an underlying, relatively thin thermally grown oxide layer commonly referred to as a "zero spacer."

For the purposes of clarity, FIG. 3 illustrates SC transistor 16 and LC transistor 18 as each including only a single set of sidewall spacers and a single source drain implantation. This notwithstanding, it will be readily appreciated that multiple spacers and multiple implants can, and typically will, be utilized in the manufacture of SC transistor 16 and/or LC transistor 18. For example, after the performance of the above-described sidewall spacer formation step and shallow implantation step, a second sidewall spacer formation step and a deeper implantation step can be performed.

Figure 4:
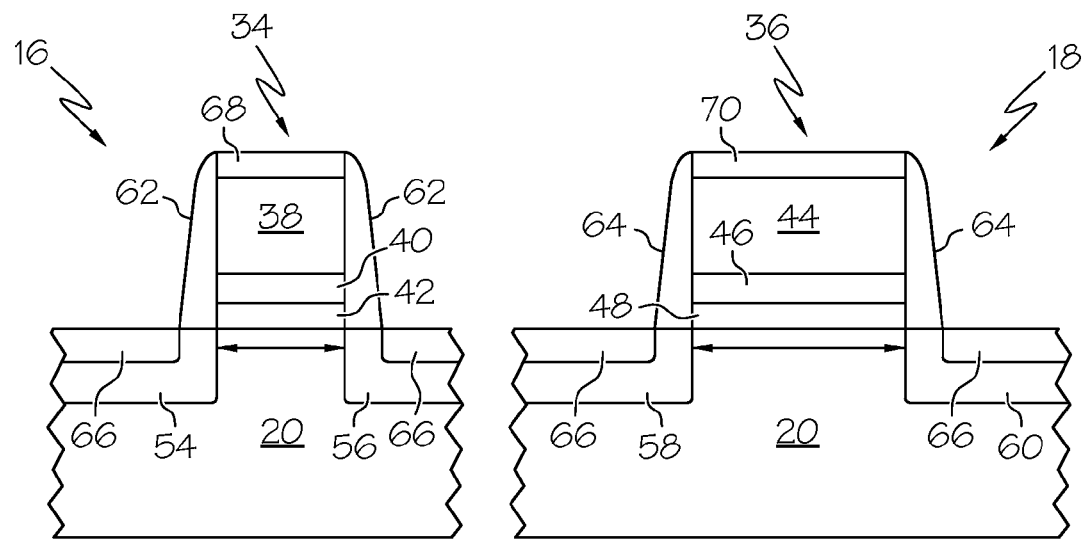

Next, as shown in FIG. 4, silicide layers are formed within the upper surfaces of the integrated circuit. In particular, a silicide layer 66 is formed within source drain regions 54, 56, 58, 60; a silicide layer 68 is formed within polycrystalline silicon layer 38 of SC gate stack 34; and, perhaps, a silicide layer 70 is formed within polycrystalline silicon layer 44 of LC gate stack 36. In one option, these layers of silicide are formed by depositing a layer of silicide-forming metal onto the surface of substrate 20 proximate source drain regions 54, 56, 58, and 60 and subsequently heating the silicide-forming metal utilizing, for example, rapid thermal annealing (RTA). Preferred silicide-forming metals include cobalt and nickel, although other silicide-forming metals may be employed (e.g., rhenium, ruthenium, palladium, etc.). The silicide-forming metal can be deposited, for example, by sputtering to a thickness of approximately 5-30 nm. Any silicide-forming metal that is not in contact with exposed silicon (e.g., the silicide-forming metal that is deposited on sidewall spacers 62, 64) does not react during the RTA to form a silicide and can subsequently be removed via wet etching in a $H_2O_2$/$H_2SO_4$ or $HNO_3$/HCl solution. Silicide layers 66 and 68 serve to increase conductivity and provide a convenient contact point. Silicide layer 70, if formed, is ultimately removed along with polycrystalline silicon layer 44 and metal gate 46 (i.e., dummy gate 50 labeled in FIG. 2) as described below in conjunction with FIGS. 11 and 12.

Figure 5:
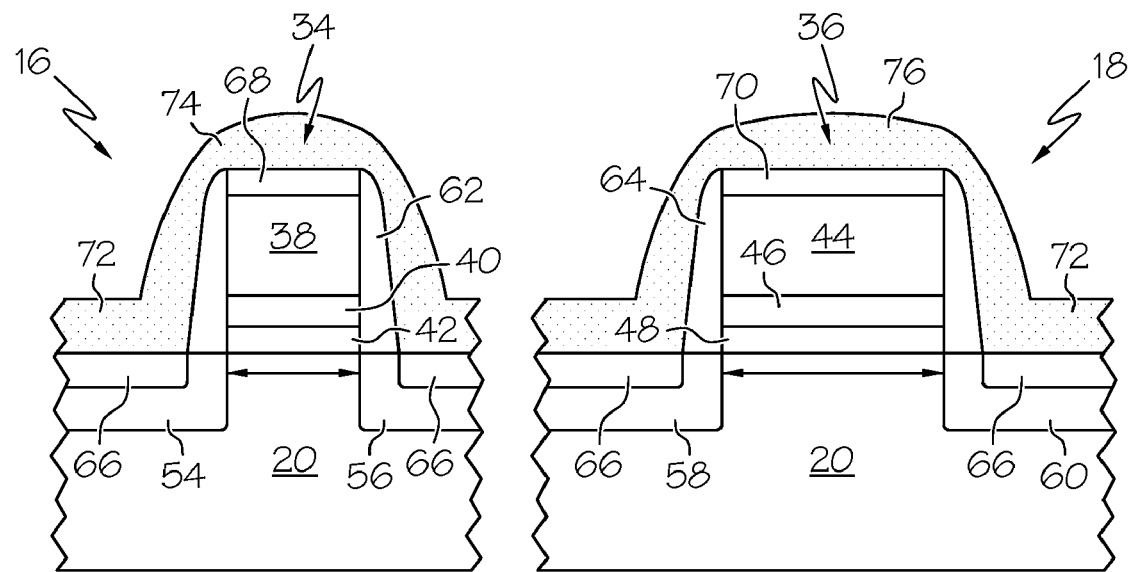

FIG. 5 illustrates the exemplary integrated circuit after a layer of etch stop material 72 has been deposited over substrate 20, SC transistor 16, and LC transistor 18. In a preferred embodiment, the layer of etch stop material 72 comprises silicon nitride deposited to a thickness of approximately 50 nanometers utilizing, for example, CVD. The deposition of etch stop material 72 over SC gate stack 34 and sidewall spacers 62 results in the production of a first raised etch stop feature 74 above SC transistor 16, and the deposition of etch stop material 72 over LC gate stack 36 and sidewall spacers 64 results in the production of a second raised etch stop feature 76 above LC transistor 18.

Figure 6:
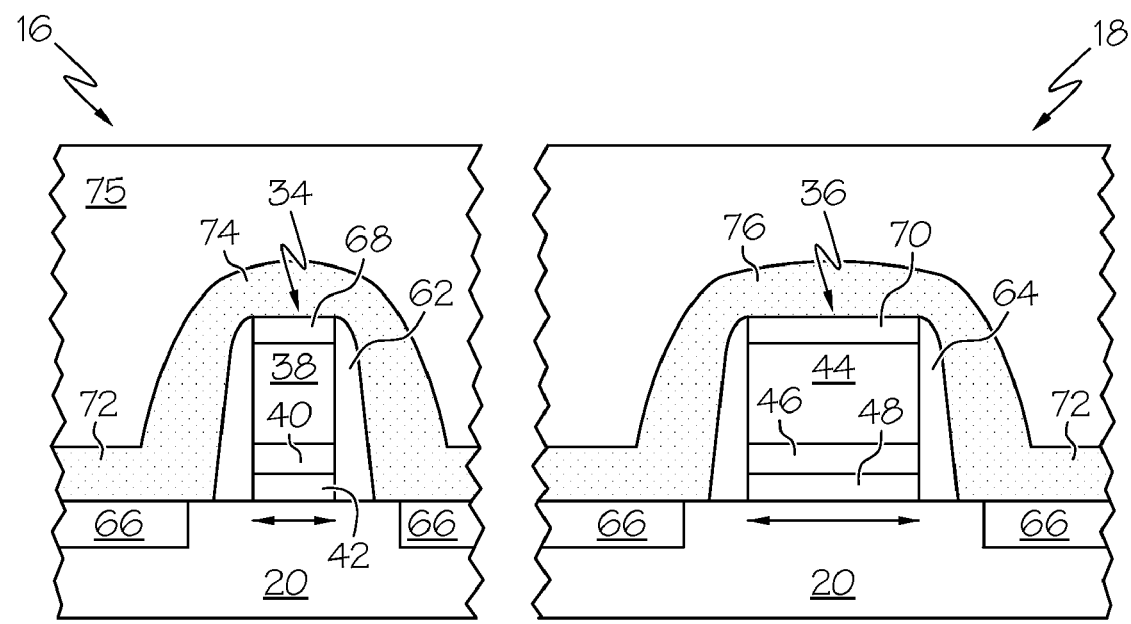
Figure 7:
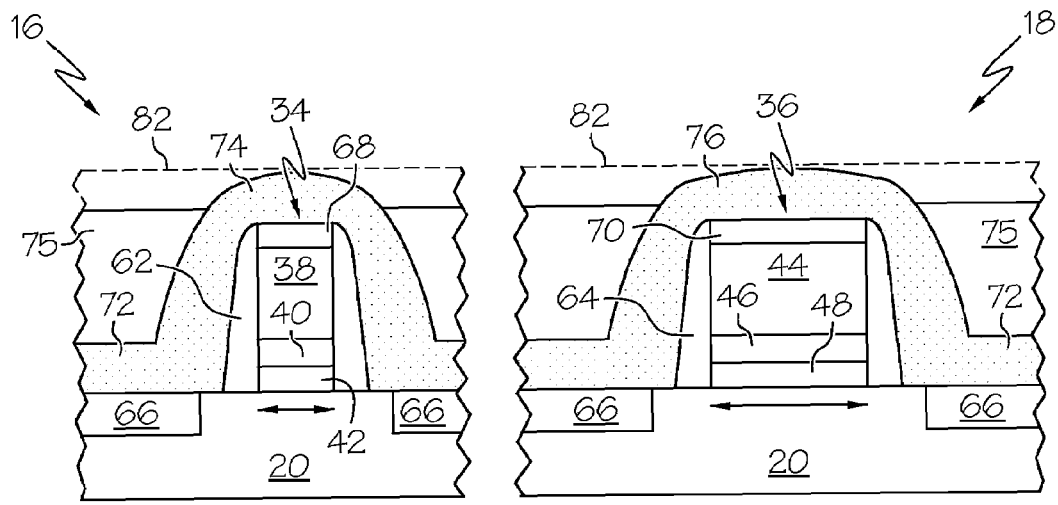

With reference to FIG. 6, an interlayer dielectric (ILD) 75 is next deposited (e.g., via CVD) over the layer of etch stop material 72 (source drain regions 54, 56, 58, 60 are not shown in FIG. 6, or any of the subsequent figures, for clarity). ILD 75 can be deposited from, for example, a TEOS (tetra-ethyl orthosilicate) source. ILD 75 is preferably deposited to a thickness sufficient to completely cover raised features 74 and 76 of etch stop layer 72. The upper surface of ILD 75 is preferably planarized utilizing, for example, a chemical mechanical polishing or planarization (CMP) process. For example, and as shown in FIG. 7, the upper surface of ILD 75 may be planarized beyond the apexes of raised etch stop features 74 and 76 to expose an upper portion of raised etch stop feature 74 and an upper portion of raised etch stop feature 76. Alternatively, the planarization may be discontinued prior to exposing raised etch stop features 74 and 76. In this latter case, the upper surface of ILD 75 may reside at a level slightly above raised etch stop features 74 and 76 after planarization as indicated in FIG. 7 by dashed line 82. Etching can then be performed to expose the upper portions of raised etch stop features 74 and 76.

Figure 8:
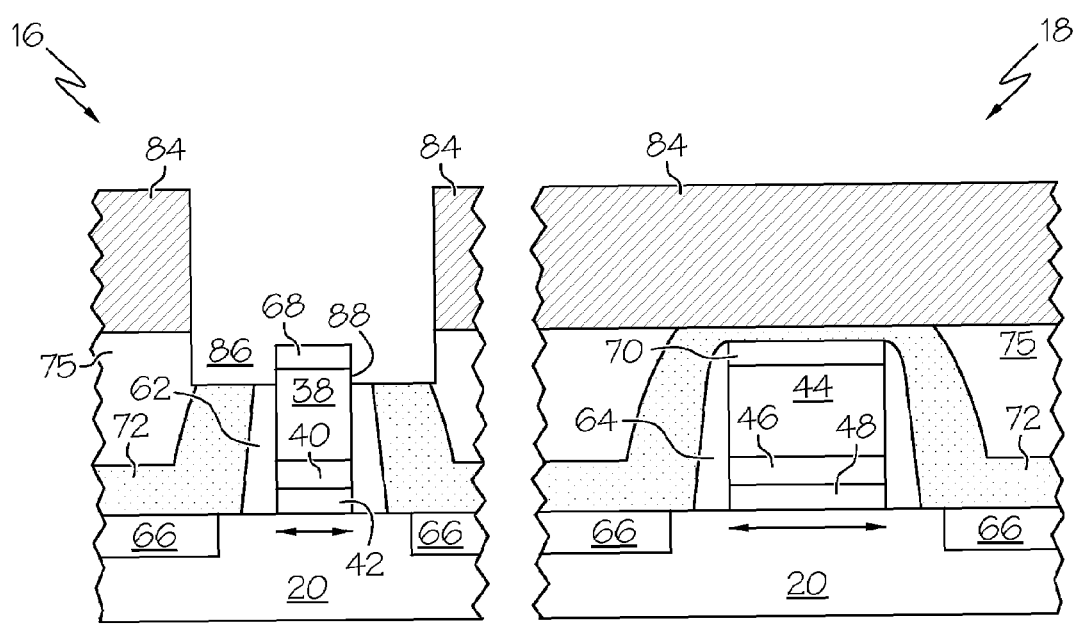

Turning now to FIG. 8, a photoresist mask 84 is placed over the upper surface of the integrated circuit and subsequently patterned. After patterning, photoresist mask 84 covers LC transistor 18 and any N-type devices included in the integrated circuit. Areas of the integrated circuit exposed through patterned mask 84 are then etched to produce an opening 86 in ILD 75 through which SC gate stack 34 and sidewall spacers 62 are exposed. The depth of the etch is preferably controlled such that the lower extremity of opening 86 is located below the upper surface of polycrystalline silicon layer 38. Stated differently, the etch is preferably performed to a depth sufficient to expose an upper portion of a sidewall 88 of polycrystalline silicon layer 38. In one specific exemplary embodiment, the etch depth is between approximately 200 to approximately 300 Angstrom.

Figure 9:
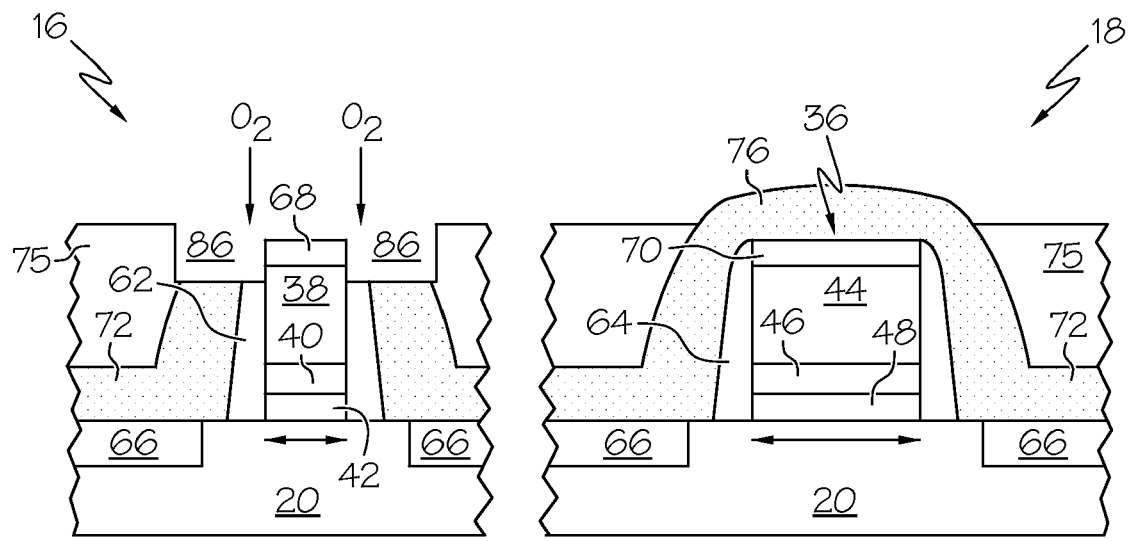

FIG. 9 illustrates an optional oxidizing step that can be performed after removing photoresist mask 84 (FIG. 8). In a preferred embodiment, the oxidizing step assumes the form of an oxygen annealing process wherein the exposed portions of sidewall spacers 62 are introduced to an oxygen ambient (e.g., approximately 5-10 parts per million $O_2$) at a predetermined temperature (e.g., approximately 400-600 degrees Celsius) for a predetermined time period (e.g., up to 30 minutes or more). During this oxygen annealing process, oxygen molecules diffuse downward through sidewall spacers 62 and into gate insulator 42 to fill oxygen vacancies within insulator 42 as described in more detail below. Notably, the oxygen molecules cannot easily diffuse through etch stop layer 72; thus, oxygen annealing has little to no effect on gate insulator 48 of LC transistor 18.

Figure 10:
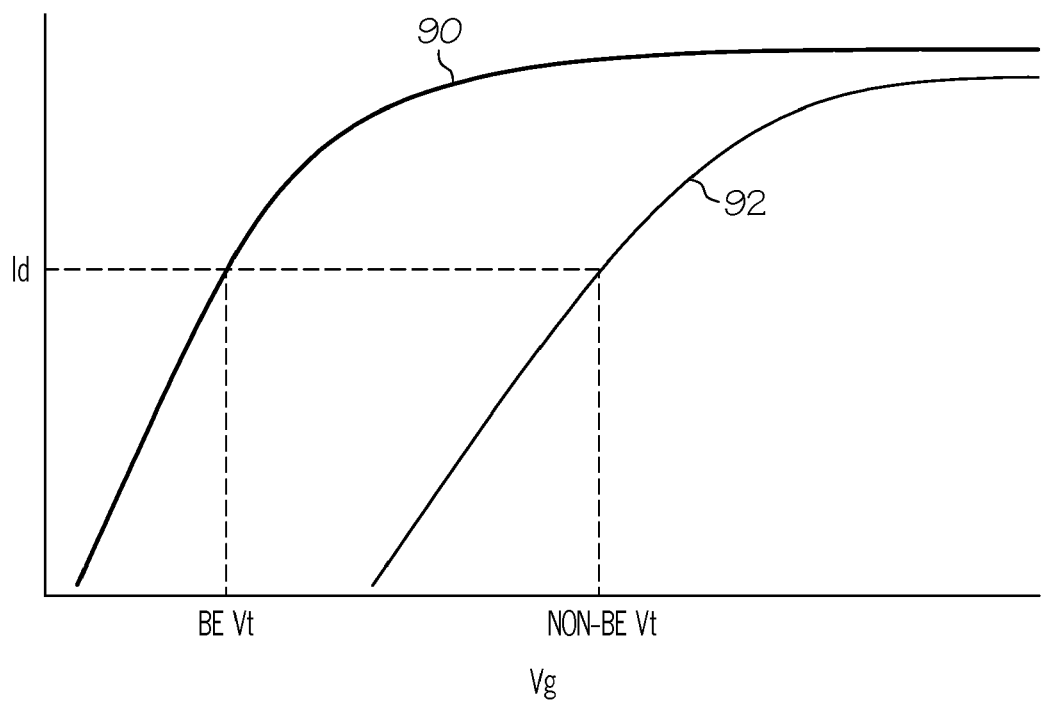
FIG. 10 is a graph illustrating the effect of the exemplary annealing step illustrated in FIG. 9 on the short channel device threshold voltage.

As previously explained, it has been discovered that positive fixed charges produced by oxygen vacancies within the gate insulator (e.g., gate insulator 42) may shift the threshold voltage ($V_t$) of a SC device away from the desired bandedge (BE) $V_t$. The oxidizing step illustrated in FIG. 9 significantly reduces or entirely eliminates these fixed charges by filling the oxygen vacancies in gate insulator 42, which permits the actual threshold voltage of SC transistor 16 to approach the desired BE $V_t$. This concept is graphically illustrated in FIG. 10 wherein drain current ($I_d$) is plotted along the horizontal axis and gate voltage ($V_g$) is plotted along the vertical axis. Two functions are illustrated in FIG. 10, namely, a pre-oxidizing function 92 and a post-oxidizing function 90. As may be appreciated by comparing function 92 to function 90, the oxidation of the gate insulator shifts the drain current-versus-gate voltage function to the left thus permitting a band edge voltage threshold to be achieved for a given drain current. This, in turn, permits SC transistor 16 to conduct more current at the same gate voltage.

Figure 11:
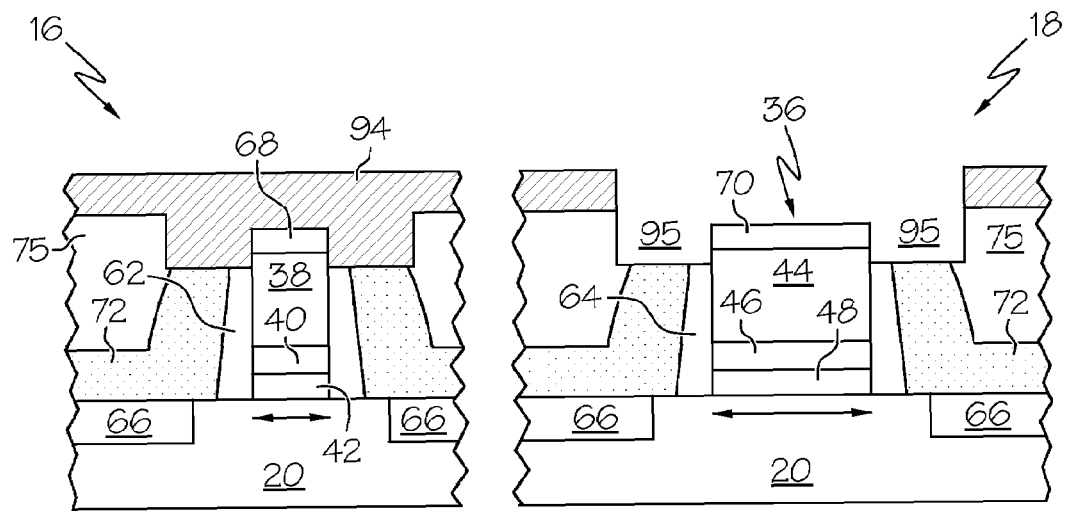
FIGS. 11-14 are simplified cross-sectional views illustrating a second group of steps performed during the exemplary device manufacturing process.

After the performance of the above-described oxidization process, a damascene process is utilized to replace silicide layer 70, polycrystalline silicon layer 44, and metal gate 46 (again, collectively referred to as the dummy gate) with a permanent metal gate. With reference to FIG. 11, a photoresist mask 94 is first placed over the integrated circuit to cover SC transistor 16 and any N-channel devices that may be included in the integrated circuit. An etching process is then performed to remove the exposed upper portion of raised etch stop feature 76 (labeled in FIGS. 5-7), an upper portion of sidewall spacers 64, and a surrounding portion of ILD 75. This etching step can be substantially identical to the etching step performed to expose SC gate stack 34 as described above in conjunction with FIG. 8. The etching process forms an opening 95 within the upper surface of the integrated circuit over LC transistor 18 thus exposing an upper portion of LC gate stack 36 and sidewall spacers 64.

Figure 12:
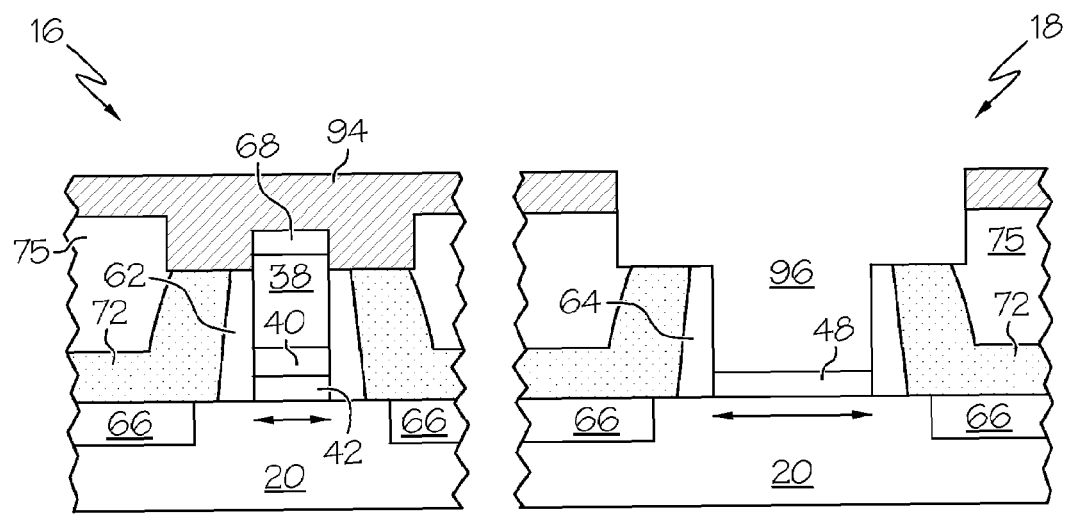

Next, and as shown in FIG. 12, a second etching step is performed to remove silicide layer 70 and polycrystalline silicon layer 44 of LC gate stack 36. While photoresist mask 94 remains over SC transistor 16, an etchant selective to polycrystalline silicon (e.g., tetra-methyl ammonium hydroxide or TMAH) is applied to at least the exposed portion of LC gate stack 36. After polycrystalline silicon layer 44 has been adequately removed, a third etching step may be performed to remove metal gate 46 or a treatment step (e.g., alloying, oxygen annealing, fluorine implanting, etc.) may be used to modify the work function of LC gate stack 36. The particular etchant employed will, of course, depend upon the metal used to form metal gate 46. If, for example, metal gate 46 comprises titanium nitride, an ammonium hydroxide or peroxide-based chemistry can be utilized to remove gate 46. Thus, through the series of etching steps illustrated in FIG. 12, the components of dummy gate 50 (i.e., polycrystalline silicon layer 44 and metal gate 46 as labeled in FIG. 2) are removed to form an LC device trench 96 between sidewall spacers 64.

Figure 13:
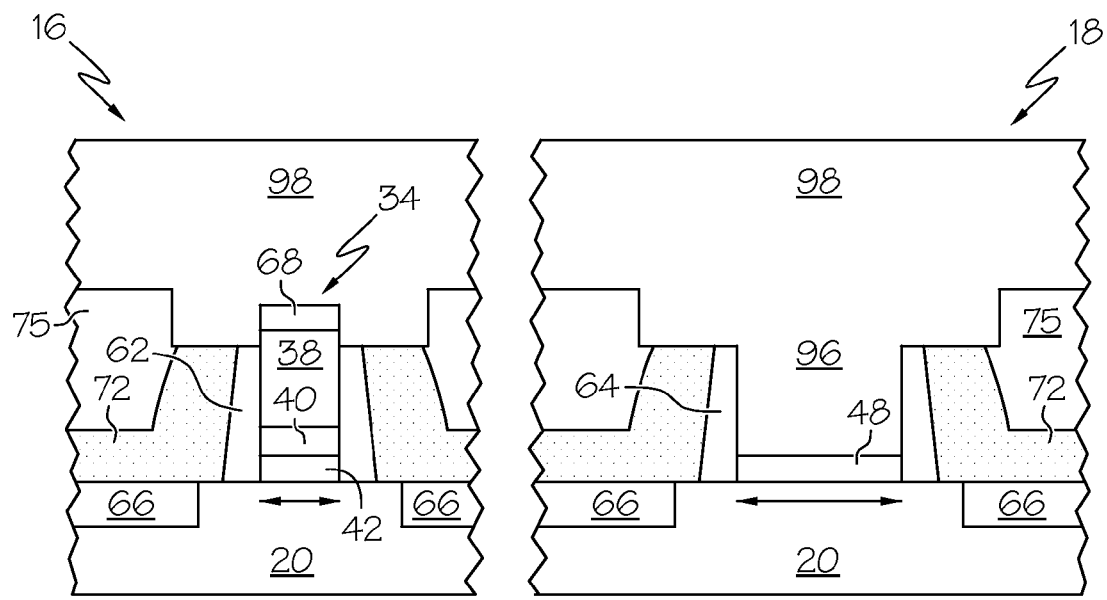
Figure 14:
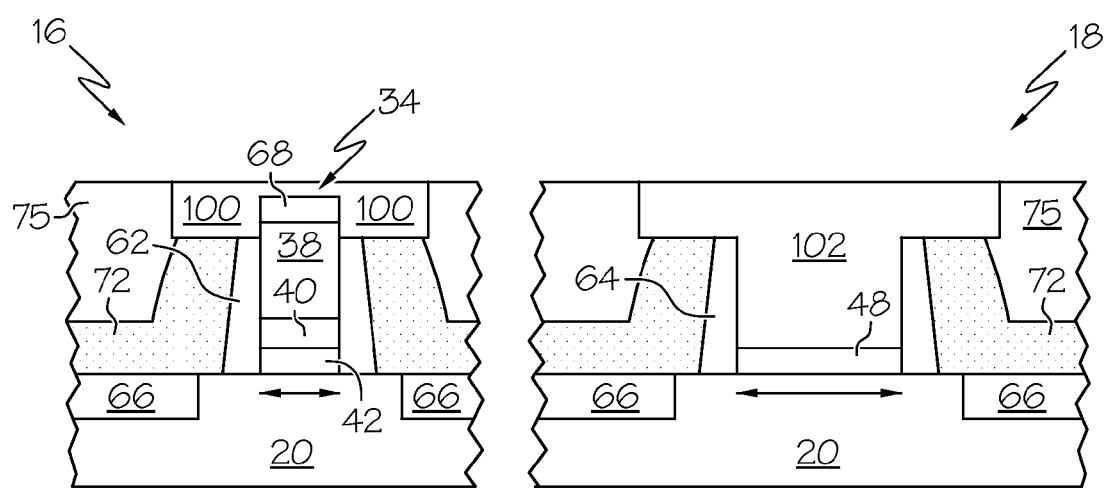

FIG. 13 illustrates SC transistor 16 and LC transistor 18 after the deposition of a metal film layer 98 over the integrated circuit and into LC device trench 96. Before the deposition of metal film layer 98, photoresist mask 94 is removed and, in a preferred embodiment, a relatively thin layer of a work function-setting metal (e.g., iridium, platinum, aluminum, ruthenium, etc.) is deposited (not shown). Deposition of the work function-setting metal and metal film layer 98 can be accomplished utilizing, for example, either a conventional electroless or a electrolytic deposition plating process. In a preferred embodiment, metal film layer 98 comprises a metal having an effective work function of approximately 4.7 to approximately 5.1 electron volts. As explained above, metals having work functions falling within this idealized range tend to be unstable at temperatures exceeding 400 degrees Celsius and are consequently referred to herein as thermally unstable metals. Examples of suitable thermally unstable metals include iridium, platinum, palladium, and ruthenium. After being deposited to a sufficient thickness and substantially filling trench 96, film material layer 98 is then polished (e.g., via CMP) to produce a substantially planar surface. FIG. 14 illustrates the integrated circuit after polishing. As shown in FIG. 14, polishing results in the production of a cap 100 surrounding and contacting SC gate state 34 and in the production of a permanent LC gate 102 filling trench 96 (labeled in FIGS. 12 and 13) and contacting gate insulator 48. Additional steps are performed to complete processing of the integrated circuit (e.g., the deposition of a second interlayer dielectric, further etching steps to provide vias to the source and drain regions, deposition of metal plugs, etc); however, such steps are well-known in the industry and are not described herein in the interests of concision.

It should thus be appreciated that there has been provided an example of a method suitable for manufacturing an integrated circuit having both short and long channel devices. The damascene-type replacement gate process described above enables thermally unstable metals to be employed in the construction of long channel devices thus enabling bandedge threshold voltages to be achieved for long channel devices. In addition, the exemplary method repairs oxygen vacancies that may occur within the short channel PFET devices thereby further permitting bandedge threshold voltages to be achieved for short channel devices. In the above-described exemplary embodiment, dummy gate replacement is described as being performed solely for a PFET long channel device (and not for a NFET long channel device); this example notwithstanding, it should be appreciated that dummy gate replacement may be performed for both PFET long channel devices and NFET long channel devices in alternative embodiments.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. Although certain embodiments of the method described above include a thin seed layer and a deposited metal layer, after subsequent heating steps that may take place during further processing the seed layer and the deposited metal layer may merge together so that a separate and distinct seed layer is not discernable. It should be understood that various changes can be made in the function and arrangement of elements without departing from the scope of the invention as set forth in the appended claims and the legal equivalents thereof.

What is claimed is:

1. A method for manufacturing an integrated circuit including a short channel (SC) device and a long channel (LC) device each overlaid by an interlayer dielectric, the SC device having an SC gate stack and the LC device initially having a dummy gate, the method comprising:

removing the dummy gate to form an LC device trench; and depositing metal gate material over the SC device and the LC device, the metal gate material contacting the SC gate stack and substantially filling the LC device trench.

2. A method according to claim 1 further comprising:
covering the LC device with a photoresist mask; and
etching a selected portion of the interlayer dielectric such that the SC gate stack is exposed through the interlayer dielectric while the dummy gate remains covered by the interlayer dielectric.

3. A method according to claim 2 further comprising the step of oxidizing the SC gate stack after etching the selected portion of the interlayer dielectric.

4. A method according to claim 3 wherein the SC device includes a sidewall spacer adjacent the SC gate stack, wherein the SC gate stack includes a gate insulator, and wherein the step of oxidizing comprises annealing the gate insulator while exposing the sidewall spacer to an oxygen ambient.

5. A method according to claim 2 wherein the SC device and the LC device are each P-type devices, wherein the integrated circuit further includes an N-type device, and wherein the step of covering comprises placing a photoresist mask on the integrated circuit covering the LC device and the N-type device.

6. A method according to claim 1 wherein the SC device and the LC device are each P-type devices, wherein the integrated circuit further includes an N-type device, and wherein the step of removing comprises:
covering the SC device and the N-type device with a photoresist mask; and
etching the dummy gate.

7. A method according to claim 6 wherein the dummy gate includes a polycrystalline silicon layer, and wherein the step of etching the dummy gate comprises exposing the dummy gate to an etchant selective to polycrystalline silicon.

8. A method according to claim 7 wherein the LC device further includes a gate insulator and a metal gate disposed between the gate insulator and the polycrystalline silicon layer, and wherein the method further comprises the step of removing the metal gate with a metal etchant after exposing the dummy gate to an etchant selective to polycrystalline silicon.

9. A method according to claim 1 further comprising:
forming an etch stop layer over a portion of the integrated circuit including the SC gate stack and the dummy gate such that the etch stop layer includes a first raised etch stop feature above the SC gate stack and a second raised etch stop feature above the dummy gate; and
depositing the interlayer dielectric over the etch stop layer to cover the first raised etch stop feature and the second raised etch stop feature.

10. A method according to claim 9 wherein the step of forming an etch stop layer comprises depositing silicon nitride.

11. A method according to claim 9 further comprising the step of planarizing the interlayer dielectric to expose an upper portion of the first raised etch stop feature and an upper portion of the second raised etch stop feature.

12. A method according to claim 9 further comprising:
planarizing the interlayer dielectric to produce a substantially planar upper surface; and
etching the substantially planar upper surface to expose an upper portion of the first raised etch stop feature and an upper portion of the second raised etch stop feature.

13. A method according to claim 1 wherein the SC gate stack includes a polycrystalline silicon layer having a sidewall, and wherein the step of etching comprises creating an opening surrounding SC gate stack and exposing at least a portion of the sidewall.

14. A method according to claim 13 wherein the step of depositing comprises substantially filling the opening with the metal gate material.

15. A method according to claim 1 wherein the metal gate material comprises a metal having an effective work function of approximately 4.7 to approximately 5.1 electron volts.

16. A method for manufacturing an integrated circuit including a short channel (SC) device and a long channel (LC) device each initially covered by an interlayer dielectric, the LC device initially having a dummy gate and the SC device having an SC gate stack including an SC gate insulator, the short channel device having a channel length less than a predetermined length (L) and the long channel device having a length equal to or greater than the predetermined length (L), the method comprising:
etching a selected portion of the interlayer dielectric such that the SC gate stack is exposed through the interlayer dielectric while the dummy gate remains covered by the interlayer dielectric;
oxidizing the SC gate stack to repair oxygen vacancies present in the SC gate insulator;
etching the dummy gate to form an LC device trench;
depositing metal gate material over the SC device and the LC device, the metal gate material contacting the SC gate stack and substantially filling the LC device trench; and
planarizing the upper surface of the metal gate material to produce: (i) a cap contacting the SC gate stack, and (ii) a permanent LC gate.

17. A method according to claim 16 wherein the predetermined length (L) is approximately 0.1 micrometer.

18. A method according to claim 16 wherein the SC device includes a sidewall spacer, and wherein the step of oxidizing comprises exposing the sidewall spacer to approximately 5-10 parts per million of an oxygen ambient at 400-600 degrees Celsius for a predetermined time period.

19. A method according to claim 16 further comprising:
forming an etch stop layer over a portion of the integrated circuit including the SC gate stack and the dummy gate such that the etch stop layer includes a first raised etch stop feature above the SC gate stack and a second raised etch stop feature above the dummy gate;
opening the first raised etch stop feature prior to oxidizing the SC gate stack; and
opening the second raised etch stop feature prior to etching the dummy gate.

* * * * *